United States Patent [19]

Hutkin

[11] 4,088,544

[45] May 9, 1978

[54] COMPOSITE AND METHOD FOR MAKING THIN COPPER FOIL

[76] Inventor: Irving J. Hutkin, 5284 Stonecourt, San Diego, Calif. 92123

[21] Appl. No.: 678,197

[22] Filed: Apr. 19, 1976

[51] Int. Cl.² ............................ C25D 1/04; C25D 1/22
[52] U.S. Cl. ....................................... 204/12; 204/281
[58] Field of Search .................... 204/12, 13, 281, 208

[56] References Cited

U.S. PATENT DOCUMENTS

| | | | |
|---|---|---|---|
| 1,760,028 | 5/1930 | Williams et al. | 204/13 |
| 2,203,253 | 6/1940 | Brown | 204/13 |
| 3,151,048 | 9/1964 | Conley et al. | 204/13 |
| 3,398,442 | 8/1968 | Palmer | 204/12 |
| 3,660,190 | 5/1972 | Stroszynski | 156/150 |
| 3,990,926 | 11/1976 | Konicek | 204/15 |
| 3,998,601 | 12/1976 | Yates et al. | 204/12 |

Primary Examiner—T. M. Tufariello

[57] ABSTRACT

The improved method of the invention comprises disposing a chromium oxide release layer on the surface of a thin inexpensive metal carrier, such as foil, depositing copper on the release layer to form a thin copper foil, and readily peeling the thus-formed copper foil from the release layer on the carrier. The release layer can be formed in situ from chromium metal electroplated on the carrier. The freshly prepared release layer contains numerous small sites on which electroplating of the copper can be easily carried out to produce pore-free copper foil. The method, which employs the carrier-release layer composite of the invention, is inexpensive and efficient, since readily available, inexpensive metal carriers can be used and no complicated copper foil-carrier separation steps need be resorted to. Moreover, it can increase the bondability of the thin copper foil thus produced to plastic during lamination thereof.

17 Claims, 2 Drawing Figures

COMPOSITE AND METHOD FOR MAKING THIN COPPER FOIL

BACKGROUND OF THE INVENTION

FIELD OF THE INVENTION

The present invention generally relates to metal foils and their manufacture, and more particularly relates to an improved method and composite for making supported thin copper foil.

Copper foil has been used for many years in the manufacture of printed circuits. The raw material for printed circuits usually is a laminate of copper foil and a thermosetting plastic, such as a phenolic or epoxy resin, which is often supported by paper, glass, cloth, or fibers. The plastic is usually applied in the uncured resinous state to the copper foil and is then heat and pressure cured to cause it to firmly bond to the foil. The finished laminate can have one or both exterior surfaces clad in this way with copper foil, whose thickness, by weight, is usually about 1 to 3 oz. per sq. ft. The various methods of making printed circuits from such laminates are well known to those skilled in the art.

In recent years it has been found desirable to make laminates for printed circuits using copper foil that is much thinner than formerly. This is dictated by a new requirement that for certain applications conducting elements be much smaller in width than previously and be spaced much closer together to facilitate circuit miniaturization. There is also a need to reduce the amount of copper removed by etching (to form the circuit conductor pattern) so as to reduce the cost of etchant and decrease etchant disposal problems.

Copper foils in thicknesses down to about 0.5 oz. per sq. ft. are made by electroplating the copper foil onto the surface of a slowly rotating steel drum, whose surface is specially prepared to prevent the copper layer from strongly adhering thereto. By controlling the speed of rotation of the drum and the electroplating conditions, the copper foil can be electroformed to a desired thickness. It is then peeled from the drum surface and wound onto a roll for further treatment, storage, or shipment. The surface of the foil formed away from the drum is considerably rougher than is the drum surface and is usually further treated to impart microscopic projections to it, so as to enhance its bondability to plastic during the subsequent lamination step.

When copper foil is made in a thickness of about 0.5 oz, per sq. ft. or less, however, it becomes very difficult to handle. Thus, when it is cut into sheets and placed in the laminating press, it often wrinkles and tears unless a carrier is used to support it or unless extreme care is exercised. For copper foils of thicknesses much less than 0.5 oz. per sq. ft., the use of a thin carrier material such as a plastic film or a metal foil is often mandatory.

Thus, in current practice, the desired thin copper foil layer is electroformed on the surface of the foil or film carrier and may also be treated while being supported there in order to enhance its subsequent bondability to the permanent plastic substrate in the laminating step.

Two general types of carriers used for such purposes are metals and plastics. Thin copper foil layers usually adhere only lightly to plastic carriers but usually adhere strongly to metal carriers. Separation of the foil from a plastic carrier is usually accomplished merely by peeling away the carrier, since the foil is usually only lightly attached thereto. But when the copper foil and carrier are strongly bonded together, that is, when the carrier is metal, then their separation must usually be attained by drastic means, such as by chemically dissolving the metal carrier away from the remaining thin copper foil.

After the copper foil is formed and treated on whatever carrier is employed, such foil and carrier are cut to the size necessary for the completed laminate. The carrier-supported foil is then assembled with the uncured usually reinforced plastic in a press, whereupon heat and pressure, for example, 200–400 deg. F. and 50–500 p.s.i., are applied to permanently bond the treated thin copper foil surface to the reinforced plastic base. Since the carrier is still attached to the other surface of the thin copper foil, it must then be removed either by peeling it away or by dissolving it off with chemicals, as described above.

In the case where the carrier is a plastic film, it must first be chemically prepared to receive a very thin metal layer by electroless desposition or by vacuum deposition and then the thin copper foil layer can be electroplated to the desired final thickness on the thin metal layer. The procedures required to chemically prepare the plastic for the initial metal layer, however, are intricate, time consuming, and require the use of expensive chemicals. Consequently the use of plastic film as the carrier material is expensive and thin copper foil produced on such a carrier is quite expensive. The preparation of plastic film by vacuum deposition of metal thereon is also expensive and reliable methods for metallizing plastics without pinholes of various sizes have not yet been developed.

Because of these deficiencies, metal foil has been considered for use as the carrier. Thus, it is electrically conductive, so that the metallizing step is averted. The particular foils that have been commercially used for this purpose have largely been copper and aluminum. Before the thin copper foil layer can be deposited over the copper carrier, however, the surface of the copper carrier must be prepared to prevent too strong an adhesion from occurring.

Various complicated procedures have been employed for this purpose, and have met with limited success. Their continued use has been motivated by the fact that it is quite expensive and difficult to dissolve the thicker copper carrier from the thin copper foil. A further problem, however, is that the copper carriers themselves are 2 mils thick, are made by electrodeposition and they are quite expensive. Like the plastic carriers, the high cost of thin copper foil produced on copper foil carriers has therefore severely restricted commercial applications.

From the standpoint of lowest cost, the most suitable materials for use as carriers for the thin copper foil would be such inexpensive metal foils such as aluminum, brass, steel, and stainless steel, in thicknesses of from 1 mil up to 10 mils, depending upon the hardness or temper of the foil. Until now, however, there has been no way to prepare these metal foils to accept a thin, nonporous copper foil layer that is lightly bonded to the carrier surface.

The use of aluminum foil as a carrier has been explored and two methods have been proposed in the past to enable the ue of the aluminum as a carrier. The first method employs copper plating directly over the inherent oxide that is always present on unprotected aluminum, but first treats the aluminum surface in an attempt to produce a uniform controlled oxide layer. This is very difficult to do, however, cannot be reliably reproduced and thus attempts usually result in the production of porous copper foil layers with widely varying adhesion to the carrier. Such foils do not separate properly, and thus cannot be recovered intact.

The second method uses the procedure called "zincating", in which the oxide of the aluminum is removed and replaced by a thin layer of zinc. However, when the thin copper foil is deposited over the zinc the adhesion between the copper foil and the zinc layer is quite strong. The second method has permitted aluminum foil to be used as a carrier, but only with the eventual separation of the thin copper foil from the zincated aluminum carrier by the expensive procedure of dissolving away the aluminum, usually in a hot caustic solution.

Therefore, there still is a substantial need to provide a simple economical method for making thin pore-free copper foil.

SUMMARY OF THE INVENTION

The foregoing needs have been satisfied by the present improved method of making thin pore-free copper foil, utilizing the composite and steps substantially as set forth in the Abstract above. Thus, the present method enables inexpensive metal foils such as brass, aluminum, steel, or stainless steel to be profitably employed as copper foil carriers by providing on their carrier surface a fresh, platable metal, specifically chromium (oxide).

Oxide films on metals are electrically nonconductive, although defects do exist in most oxide layers through which an extremely small amount of current will pass. Oxides of chromium, however, particularly when freshly formed, are uniformly thin and contain many such defects or holes through which current readily can pass. It is at these hole sites during electroplating, that proper nucleation of the deposited copper metal occurs. The density of these sites is so great in the case of freshly prepared chromium oxides, that copper plating on the nucleated sites soon grows laterally to affect complete coverage of the carrier surface and pore-free copper foil.

Moreover, very little adhesion is attained between the plated copper metal foil and the chromium oxide, so that the plated copper metal foil can be easily peeled away from the carrier without damage. Other metals that perform similar to chromium for this purpose are nickel and cobalt. In contrast, oxides of most other metals such as aluminum also have nucleating sites but such sites are not numerous enough nor are they sufficiently uniformly distributed. Consequently, electroplating copper over such oxides results in a lace work pattern of deposited copper metal. The copper foil product remains porous and contains numerous holes and is completely unsatisfactory. Further advantages of the present invention are set forth in the following detailed description.

DRAWINGS

DETAILED DESCRIPTION

Figure 1:
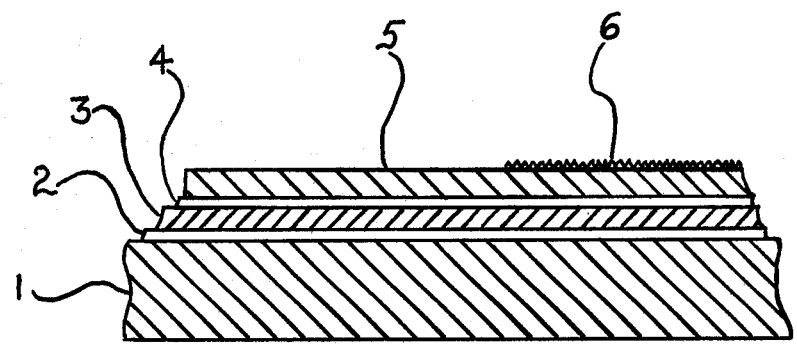
FIG. 1 is a side elevation view of a composite metal-foil product formed by utilizing the processes of the invention.

In accordance with the improved method of the present invention for the manufacture of thin, pore-free copper foil, a thin chromium (oxide) release layer is deposited on the surface of a selected thin metal carrier, the release layer containing a plurality of small sites which enable copper to be subsequently electroplated thereon and to form a pore-free foil. As shown in FIG. 1, the carrier preferably is a relatively inexpensive metal foil 1, for example about 1 to 20 or more mils in thickness. Such foil may be, for example, brass, stainless steel or mild steel but preferably is aluminum. Each of these foils is inexpensive and suitable for use with the release layer.

When aluminum is used, the aluminum is etched in a suitable solution, for example, caustic soda solution, to remove the aluminum oxide therefrom and then very lightly coating the etched aluminum surface with tin or zinc 2, as in an electroless zincating or tinating bath. For example, the aluminum can be zincated in an aqueous solution which includes sodium hydroxide, zinc oxide, ferric chloride and Rochelle salt (potassium-sodium tartrate, $KNa_4C_4H_4O_6 4H_2O$).

Mild steel and brass can be activated in any suitable manner, as by dipping them into a 10% HCl aqueous bath for 5–15 seconds at room temperature, while stainless steel can be activated in 50% aqueous HCl solution at room temperature for 3 minutes while being subjected to a current density of 5 amps per sq. ft. (a Cathodic etch).

The chromium (oxide) layer 3 is preferably formed in situ on the activated carrier metal surface by electroplating onto that surface a thin layer, for example, about 20–500 microinches, of chromium, which effectively covers the carrier surface. The chromium can be deposited in any other suitable manner, if desired, for example, in the methods disclosed in detail in U.S. Pat. No. 1,967,716 to Mahlstedt and U.S. Pat. No. 2,686,756 to Stareck. However, an electroplating procedure is preferred, for example, which utilizes a current density of about 10–200 amps per sq. ft. (a.s.f.) for about 2–10 minutes with a bath such as one comprising an aqueous solution of chromic acid and sulfuric acid to produce the desired minimum thickness of the release layer. The freshly deposited chromium instantly forms a surface layer of chromium oxide 4 even as it is rinsed after leaving the chromium electroplating bath.

Alternately, a nickel or cobalt layer can be used, in place of the chromium, over the activated or zincated foil surface as a release layer. Chromium is, however, preferred.

The composite of the present invention can thus be produced by the described electroplating step of the present method.

As a subsequent step in the present method, copper 5 is substantially immediately deposited on the freshly in situ-formed chromium oxide release layer 4, the copper deposition being carried out normally by electroplating, although vapor deposition, electroless plating the other methods are possible, but usually commercially impractical. The release layer is rinsed to remove traces of the chromium electroplating bath before the copper deposition is carried out.

Such copper deposition continues until a uniform, pore-free thin copper foil layer 5, usually less, often substantially less, than about 0.5 oz. per sq. ft. is built upon the carrier surface which bears the release layer.

Thus foils of thicknesses as low as about 0.1 oz. per sq. ft. can be built up by electrodeposition on the release layer and can be successfully incorporated into laminates and utilized in the manufacture of miniaturized printed circuitry and the like.

The copper foil formation can be effected by utilizing either a single solution or two different copper plating solutions, that is, an initial strike step followed by a built-up step. Thus, the copper foil can be formed on the chromium oxide layer of the carrier from a single acid copper plating solution, the formulas of which are well known to those versed in the art.

A typical acid copper bath utilizable for such purposes comprises 27 oz. per gal. of copper sulfate and 10 oz. per gal. of sulfuric acid, the remainder being water. Additives may be used in such acid copper bath so as to cause the copper foil to exhibit selected crystal properties. The copper deposition can be effected at, for example, about 70 deg. F. and about 25 a.s.f. The copper deposited during the electroplating can be controlled so as to favor the formation of columnar crystals or equiaxed crystals, as can the smoothness of the exposed copper surface thus formed. Small additions of gelatin, phenylsulfonic acid or glue to the electrolysis bath promote the columnar formation of copper crystals while additions of thiourea, molasses or dextrin promote a smooth deposit of equiaxed crystals.

It may instead be desirable to first deposit an initial small layer or strike of copper onto the chromium oxide layer on the carrier surface from a "strike bath", before building up the copper foil. A Rochelle-type copper cyanide strike solution can be used at 40° C.

A typical aqueous solution contains:
 5.5 oz/gal of copper cyanide
 6.6 oz/gal of sodium cyanide
 4.0 oz/gal of sodium carbonate
 8.0 oz/gal of Rochelle salt (potassium sodium tartrate)

This strike bath usually is used at a current density of 25 amps per sq. ft. (a.s.f.) to produce an initial dense, non-porous copper strike layer on the chromium oxide surface of the carrier. After rinsing off the strike bath, electroplating is continued to build up the copper foil to its desired thickness in the previously described acid copper plating bath or its equivalent. If desired, after the initial flash of copper is deposited on the fresh chromium oxide surface, the carrier with the copper flash thereon can be stored indefinitely since the copper flash will preserve the release characteristics of the chromium oxide layer. When it is later desired to complete the build-up of the copper to the desired final foil thickness, the copper flash can be easily activated by methods well known to those skilled in the art and then the necessary copper can be added by electroplating on the copper flash. This is most easily done using the acid copper bath mentioned or other similar formulations.

To enhance the bond between the copper foil and a plastic substrate to which it is to be laminated before it is converted into desired circuitry, microscopic projections of copper and copper oxide 6 can be electrochemically produced on the exposed copper surface. A method known to those skilled in the art as "oxide treatment" can be used for such purposes as is that in which an excessive current density is used for the particular copper bath chemistry, temperature and agitation. The resulting deposit 6 consists of microscopic particles of mixed copper metal and copper oxide projecting from the exposed copper foil surface. Typical "oxide treatments" of this type are described in U.S. Pat. Nos. 3,220,897 (issued 1965) to Conley and 3,699,018 (issued 1972) to Carlson.

More recently, it has been found that improved results can be obtained if such "oxide treatment" is followed by a electroplating cycle in which a small amount of sound copper is deposited over the oxide to encapsulate it. To provide the "oxide treatment", an aqueous bath comprising:
 6 oz/gal of copper sulfate
 13 oz/gal of sulfuric acid
can be, for example, operated at room temperature at a current density of 110 amps per sq. ft. for approximately 30 seconds. After rinsing, the described encapsulation can be carried out using a bath of the same chemistry as the acid copper built-up bath mentioned above. A current density of 25 amps per sq. ft. for 2 minutes will provide the desired encapsulation.

Figure 2:
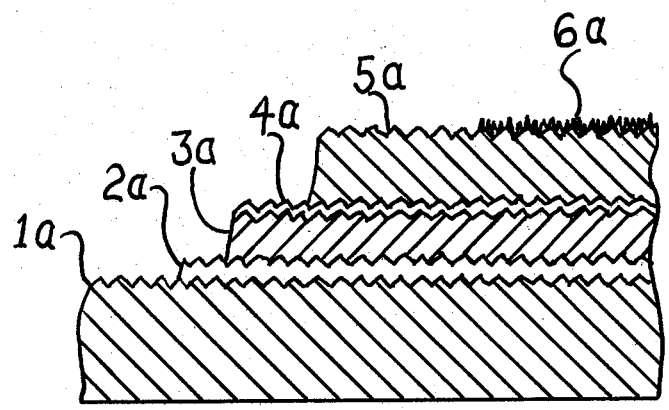
FIG. 2 is a side elevation view of a composite foil product formed by an alternative embodiment of the invention.

When a higher level of adherence between copper foil and laminate is required, than can be imparted alone by the aforementioned treatment, it has been found desirable that the surface 1a (FIG. 2) of the copper foil be produced rough in texture prior to the "oxide treatment" above. If the surface of the carrier metal is purposely made rough in texture and is covered with a minimum thickness of chromium 3a deposited thereover, (i.e., 20 to 200 u″) the roughened texture of the carrier is retained and is reproduced in the thin copper foil 5a that is electrodeposited over the chromium release layer.

The roughness of the carrier foil surface should be such that it does not cause small areas of the copper layer to be torn away when separating it from the carrier. Thus, the surface should ideally have a microscopic surface configuration resembling pyramidal projections that are 0.1 to 0.5 mils in height. Other roughened surface configurations having open recesses would also be suitable.

Prior to depositing the chromium layer, the carrier can have the desired surface roughness imparted by one of several methods. Mechanical roughening by wire brushing or by sand blasting of the carrier surface is satisfactory. Chemical etching and/or anodic etching techniques can also be used to roughen the surface of the metals used as the carrier. Macroetching techniques are well known to those skilled in the art, and specific examples for the carrier metals are described later. When properly roughened, the formerly smooth surface of the carrier will appear matte or frosted.

The rougher textured copper foil may be "oxide treated" to form layer 6a as described above to further enhance bondability or in certain applications it could be laminated without further treatment.

The thin copper foil is now complete and is ready to be laminated to a plastic base to form the printed circuit laminate. In one embodiment of the present invention, the composite of the invention includes the copper foil layer disposed on the chromium oxide layer on the carrier foil and thus is producible by the first two steps of the present method.

In accordance with the third step of the present method, the thin copper foil disposed on the chromium (oxide) layer on the thin metal carrier foil is readily peeled therefrom. This normally occurs after a plastic substrate has been laminated to the exposed side of the copper foil, as per conventional laminating conditions well known in the art, and after cutting and sizing of the laminate, but before etching of the final conductor pattern therein. The peeling is very easy, only light finger pressure being required to separate the carrier (with release layer thereon) from the copper foil. Accordingly, the present method provides very thin copper foil in an improved manner. Further aspects of the invention are set forth in the following specific examples.

EXAMPLE I

Commercially pure aluminum foil approximately 3 mils thick and in the ½ hard condition is used as the carrier foil in Test A. In Test B aluminum foil which is in ¼ hard condition has a thickness of 7 mils, while in Test C aluminum foil which is about ¾ hard is used and has a thickness of 2 mils.

In Test A, the aluminum foil carrier is prepared to receive the fresh chromium which forms the chromium oxide release layer by first etching and then "zincating" it. Such procedure results in a very thin layer of easily platable zinc over the aluminum surface instead of the aluminum's own hard-to-plate oxide layer. The etching of the aluminum is carried out by immersing the aluminum foil in an aqueous bath comprising 8–10 oz. per gal. of caustic soda at 180°–200° F. for 5–10 seconds. After water rinsing, the etched aluminum is immersed in a 50% aqueous nitric acid solution and after water rinsing, the foil is zincated in the following aqueous solution for 30 seconds at room temperature:

| Sodium Hydroxide | 70 oz/gal. |
| Zinc Oxide | 13 oz/gal. |
| Ferric Chloride | 0.13 oz/gal. |
| Rochelle Salt | 1.3 oz/gal. |

In Test B, "double zincating" is carried out: that is, the etching bath is replaced with a separate aqueous zincating solution as follows:

| Sodium Hydroxide | 70 oz/gal. |
| Zinc Oxide | 13 oz/gal. |

In this procedure, the nitric acid treating step causes removal of the zinc layer deposited in the first zincating step, and such layer is replaced in the second zincating step with a more uniform zinc layer.

In Test C, the etching and nitric acid treating are carried out as in Test A. However, the zincating step of Test A is eliminated and a tinating step is substituted. Thus, a "tinate" solution is used that leaves on the aluminum a thin layer of tin instead of zinc. This aqueous solution comprises the following:

| Potassium Stannate | 8 oz/gal. |
| Potassium Cyanide | 7.5 oz/gal. |
| Potassium Hydroxide | 12.5 oz/gal. |

The aluminum foil is immersed in the tinate solution for about 45 seconds at room temperature. Alternately, a proprietary solution that is easier to control is available from the M & T Chemical Company and is called the "Alstan Process".

The zinc or tin coated-aluminum foil, that is, the foil of Test A, B and C, in each instance after rinsing, is passed into an aqueous solution containing:

| Chromic Acid | 45 oz/gal. |
| Sulfuric Acid | .45 oz/gal. | and is electroplated with a layer of relatively crack-free chromium for about 2–10 minutes at a current density of 10–200 a.s.f. Thus, a current density of 150 a.s.f. is applied for 2 minutes in Test A, while 80 a.s.f. is applied for 6 minutes in Test B and 40 a.s.f. for 10 minutes in Test C. In each instance, the plating conditions of time and current density are selected such that a minimum thickness of chromium is deposited to give complete chromium oxide coverage of the zinc or tin coated surface. Depending upon the roughness of this surface, this is accomplished by the time 20–50 microinches of chromium have been deposited. In this electroplating step, non-consumable lead anodes are placed opposite the foil surface to be plated, although lead alloy anodes or other types could be used.

If each of Tests A, B and C, the aluminum foil carrier is immediately rinsed after the chromium electroplating step and is immediately thereafter electroplated with copper to form the desired thin copper foil on the chromium oxide release layer which has formed in situ on the aluminum carrier. The copper electroplating is carried out at 45 a.s.f. for 9 minutes at a temperature of about 80° F., while the chromium oxide layer contacts an aqueous bath comprising 27 oz. per gal. of copper sulfate and 10 oz. per gal of sulfuric acid. A pure, pore-free thin copper foil having a thickness calculated as 0.3 oz. per sq. ft. is produced on the chromium oxide release layer.

In each of Tests A, B and C, the copper foil is supported by the aluminum foil carrier and can be cut, stocked, etc. therewith without wrinkling, tearing, etc. but also can be peeled therefrom with only light pressure. Accordingly, extremely thin yet supported copper foil is produced in a simple inexpensive method and is suitable for use in a variety of fabrication techniques, including manufacture of miniaturized printed circuit boards.

Tests D, E and F are also conducted parallel to Tests A, B and C, respectively, with the same variation in chromium deposition conditions except that in each of Tests D, E and F, the freshly produced chromium oxide layer is immediately subjected to a copper striking step utilizing a current density of 25 a.s.f. at 40° C. and an aqueous bath containing:

5.5 oz. per gal. of copper cyanide
6.6 oz. per gal. of sodium cyanide
4.0 oz. per gal. of sodium carbonate
8.0 oz. per gal. of Rochelle salt After rinsing, the copper-struck chromium oxide layer is then copper electroplated, as called for in Tests A, B and C, but to an overall thickness of 0.25 oz. per sq. ft. at about 50 a.s.f. over 6 minutes at about 80° F. The full copper electroplating is in tests D, E and F, carried out one week after the copper striking. In Tests D, E and F, the copper strike is activated as follows immediately before the main copper electroplating step: Immerse in 10% sulfuric acid solution for 10 sec. at room temperature.

The results obtained in Tests D, E and F are substantially identical with those of Tests A, B and C.

EXAMPLE II

In Test G, a mild steel foil about 5 mils thick is activated by dipping it in a 10% aqueous HCl bath for 5–15 seconds at room temperature (70° F). The same procedure is utilized in Test H, but substituting a brass foil also 5 mils thick for the mild steel foil. In Test I, a stainless steel foil 5 mils thick is activated by cathodically etching it in 50% aqueous HCl solution at 70° F. for 3 minutes while subjecting it to a current density of 5 a.s.f., a standard activation procedure.

The foils of Test G, H and I are then electroplated with chromium utilizing the procedures of Examples I, specified for the foils of Tests A, B and C, respectively, and then immediately water rinsed and copper electroplated by the same procedure as applied to the foils of Tests A, B and C.

In Tests J, K, L and M, foils identical to those of Tests G, H and I are processed identically thereto, except that foils J, K, L and M are roughened during their activation in order to provide them with rough surfaces thereby imparting the same to the copper foil when deposited thereover. Such surfaces enhance the bondability of the thin copper foil to a plastic substrate during lamination thereof and either obviate or reduce the requirements for the "oxidizing treatments" described above.

In the case of Test J, the mild steel foil, the roughening is effected by the etching thereof, during activation, as follows: Dip in 10% HCl solution at room temperature for 15 seconds. Rinse and anodic etch in 35% $H_2SO_4$ at 80° F. for 1 minute with a current density of 100 a.s.f.

In the case of Test K, the brass foil, the roughening is effected by the etching thereof during foil activation, as follows: Dip in 10% fluoboric acid + 6½ oz. of 30% hydrogen peroxide solution per gal. for 2 minutes.

In the case of Test L, the stainless steel, the roughening is effected by the etching thereof, is accomplished by extending the described cathodic etching activation procedure; that is, by increasing the cathodic etching time to about 5 minutes, when utilizing the other parameters specified for Test I.

In the case of Test M, the aluminum foil, the roughening is effected by etching thereof by carrying out the activation in Na oH — 5 oz. per gal., plus NaF — 1½ oz. per gal. at 150° F. for 3 to 5 minutes after which it is rinsed and dipped in 30% nitric acid. It is then treated in the zincating solution prescribed for Test A.

The foils of Test J, K, L and M are each then treated to deposit a layer of chromium and a layer of thin copper in the manner prescribed for Test B.

In each instance, the then copper foil produced by the present method is completely suitable in all respects, is well supported and protected by the carrier from damage, and thus can be laminated, cut, shaped, etc. into desired components and otherwise processed with increased ease. Such thin copper foil in the case of test foils J, K, L and M exhibit increased bondability of plastic substrates and is ideally suited for use in the manufacture of miniaturized circuitry and the like. Other advantages are as set forth in the foregoing.

Various modifications and changes can be made in the present method, its steps and parameters and in the present composite, its components and parameters. All such modifications and changes as are within the scope of the appended claims form part of the present invention.

What is claimed is:

1. An improved method of making a thin, substantially pore-free copper foil, which method comprises:
   a. disposing on the surface of a thin aluminum metal carrier a thin layer of zinc or tin;
   b. disposing on said layer of zinc or tin a thin chromium release layer containing a plurality of plating sites;
   c. depositing a copper layer on said release layer to form a thin, substantially pore-free copper foil;
   d. bonding the exposed face of said copper foil to a substrate to form a laminate; and
   e. separating said release layer from said foil.

2. The improved method of claim 1 wherein said release layer is formed in situ and wherein said copper is deposited on said release layer substantially immediately after it is rinsed and wherein said rinsing is effected substantially immediately after said formation in situ.

3. The improved method of claim 1 wherein said release layer is electroplated on said metal carrier surface and wherein said carrier is foil.

4. The improved method of claim 3 wherein said release layer has a thickness of about 20-500 microinches and wherein said substrate comprises plastic.

5. The improved method of claim 1 wherein said metal carrier surface is roughened sufficiently to increase the bondability of said copper foil to plastic.

6. The improved method of claim 3 whereby said carrier surface is roughened by etching.

7. The improved method of claim 1 wherein said carrier is about 1-20 mils thick and wherein said copper foil, together with said carrier and release layer, are cut to predetermined size before said laminating.

8. The improved method of claim 4 wherein said carrier comprises aluminum foil about 1-20 mils thick, wherein said aluminum surface is etched and zincated before said release layer is electroplated thereon and wherein said copper is electroplated on said release layer to a thickness of less than about 0.5 oz. per sq. ft. to form said copper foil.

9. The improved method of claim 8 and further including the deposition of a thin layer of copper and copper oxide nodules on said copper layer, to enhance the bondability of said layer to plastic.

10. An improved unitary composite comprising, in combination:
   a. a thin aluminum carrier having a roughened surface;
   b. a thin metallic layer selected from the group consisting of tin and zinc disposed on said roughened surface;
   c. a release layer of metal selected from the group consisting of chromium, nickel and cobalt on the surface of said metallic layer;
   d. a thin copper foil layer disposed on said release layer;
   e. a layer of copper and copper oxide nodules disposed on said copper foil layer to enhance its bondability to plastic; and,
   f. a plastic substrate bonded to said layer of copper and copper oxide nodules.

11. An improved unitary composite comprising, in combination:
   a. a thin aluminum carrier;
   b. a thin metallic zinc or tin layer disposed on said aluminum carrier;
   c. a chromium release layer deposited on the surface of said zinc layer; and
   d. a thin copper foil disposed on said release layer.

12. The improved composite of claim 11 wherein said aluminum carrier has a roughened surface.

13. The improved composite of claim 12, and further including a layer of copper and copper oxide nodules disposed on said copper layer to enhance bondability of said copper layer to plastic.

14. The improved composite of claim 11 and further including a substrate suitable for a printed circuit laminated to said copper foil.

15. The improved composite of claim 13 and further including a substrate laminated to said layer of copper and copper oxide nodules.

16. The improved composite of claim 11 wherein said release layer is about 20–500 microinches thick.

17. The improved composite of claim 11 wherein said aluminum is about 1–20 mils thick.

* * * * *